United States Patent [19]

Slobodnik, Jr. et al.

[11] 4,005,378

[45] Jan. 25, 1977

[54] SURFACE ACOUSTIC WAVE FILTER

[75] Inventors: Andrew J. Slobodnik, Jr., Malden; Kenneth R. Laker, Arlington, both of Mass.

[73] Assignee: The United States of America as represented by the Secretary of the Air Force, Washington, D.C.

[22] Filed: Nov. 25, 1975

[21] Appl. No.: 635,005

[52] U.S. Cl. ................. 333/72; 310/8.2; 310/9.8; 333/30 R

[51] Int. Cl.² ............ H03H 9/04; H03H 9/26; H03H 9/32; H01L 41/10

[58] Field of Search ............ 333/72, 30 R, 71; 310/8-8.3, 9.7, 9.8

[56] References Cited

UNITED STATES PATENTS

| | | | |
|---|---|---|---|
| 3,663,899 | 5/1972 | Dieulesaint et al. | 333/72 X |
| 3,699,364 | 10/1972 | Gerard | 310/9.8 |
| 3,755,761 | 8/1973 | Hartmann | 333/30 R X |

*Primary Examiner*—Alfred E. Smith
*Assistant Examiner*—Marvin Nussbaum
*Attorney, Agent, or Firm*—Joseph E. Rusz; Willard R. Matthews, Jr.

[57] ABSTRACT

A surface acoustic wave bandpass filter having a flat frequency response in the passband and an exponentially decaying out-of-band response is realized by designing its transducer electrodes to have an appropriate number of discretely apodized interdigital fingers. The apodization or overlap coefficients $H_a(N)$ of adjacent fingers are determined from an analytically derived expression that incorporates factors for the filter time length parameter, the filter center frequency, bandwidth, transition bandwidth falloff, and a ripple reduction parameter.

2 Claims, 7 Drawing Figures

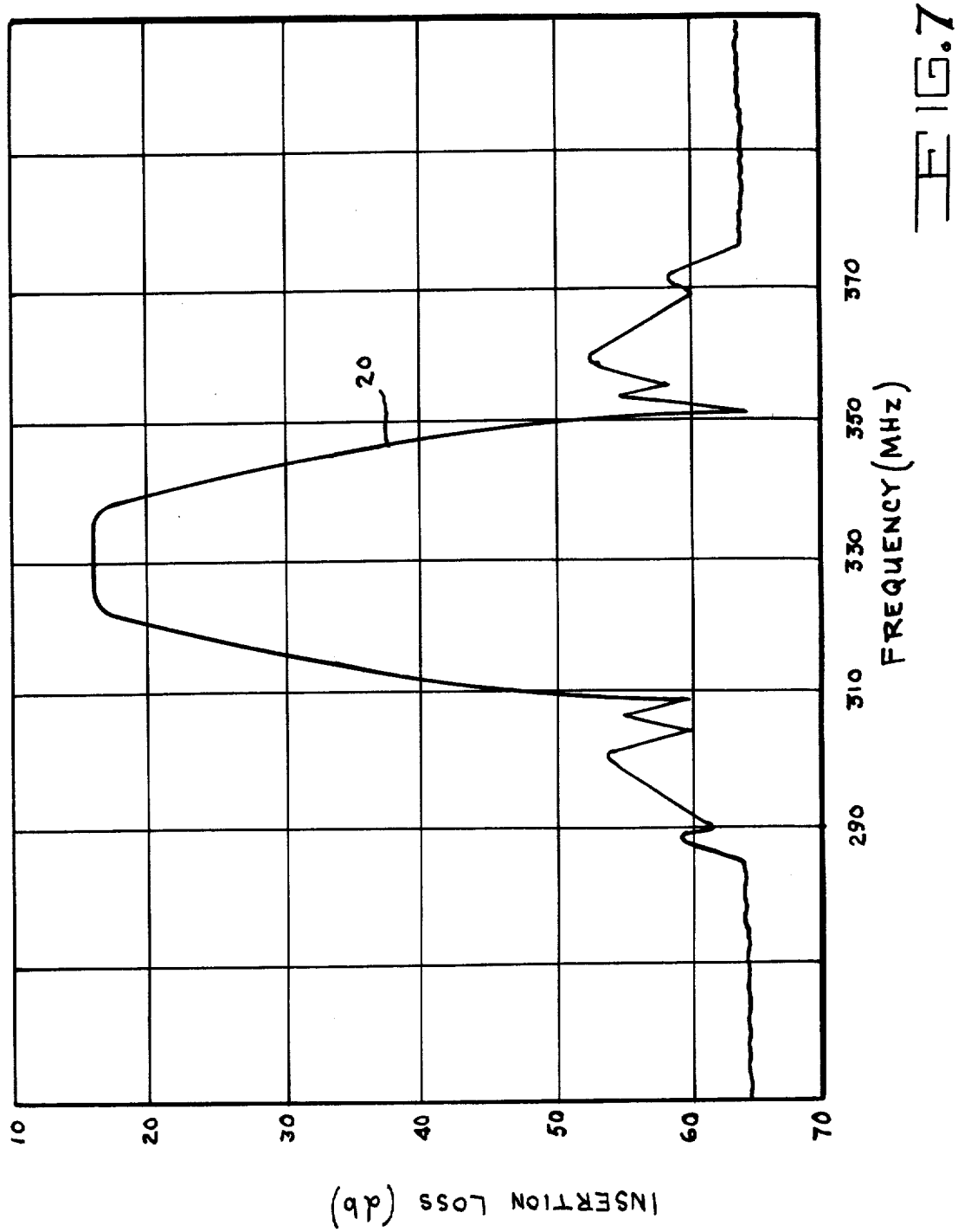

SURFACE ACOUSTIC WAVE FILTER

STATEMENT OF GOVERNMENT INTEREST

The invention described herein may be manufactured and used by or for the Government for governmental purposes without the payment of any royalty thereon.

BACKGROUND OF THE INVENTION

This invention relates to surface acoustic wave devices, and in particular to an improved method and means for realizing surface acoustic wave filters that exhibit linear phase and flat in-band-exponentially decaying out-of-band frequency response characteristics.

Surface acoustic wave technology has become attractive for a wide variety of signal processing applications due to factors such as compactness, light weight, reliablitiy, and advantages of fabrication by well established planar techniques. Acoustic waves which travel along the surface of a piezoelectric solid can be tapped with interdigital transducers thus forming a transversal filter and providing a powerful tool for realizing some very useful filters not easily synthesized with other classical analog filter techniques.

Many filter response functions which are very difficult to realize with lumped element networks can be more easily achieved with surface acoustic wave devices. Filters for pulse applications which simultaneously achieve a flat magnitude and linear phase response are one example.

Frequently the requirements of these and other filter applications call for both excellent low distortion time domain properties and good frequency selectivity. In order to achieve this, there are required filters and filter design techniques that allow optimization of the trade off between achieving a low distortion time domain response while maintaining good frequency selectivity. Such optimization is particularly necessary when filtering pulses which have frquency spectra of the order of the filter bandwidth.

The present invention therefore is directed toward providing surface acoustic wave filters and design and construction techniques that meet such requirements and that permit virtually any trade off between time and frequency performance.

SUMMARY OF THE INVENTION

The present invention comprehends the design and realization of a novel surface acoustic wave (SAW) bandpass filter having a flat frequency response in the passband and an exponentially decaying out-of-band response.

The structure of the invention comprises a surface acoustic wave substrate member having input and output transducer electrodes. The transducer electrodes are designed to have a particular number of interdigital fingers and a particular overlap or apodization between adjacent fingers. The number of interdigital fingers is determined as being equal to $4(f_o\tau) + 2$ where $f_o$ is the filter center frequency, $\tau$ is the filter time length parameter and the expression $4(f_o\tau) + 2$ is an integer.

Interdigital finger overlap is determined from the expression $$H_v[N] = \left( \frac{\sin \pi B N/2f_o}{\pi N/2f_o} + \frac{2K\cos \pi B N/2f_o}{K^2 + (\pi N/f_o)^2} - \frac{(2\pi N/f_o)\sin \pi B N/2f_o}{K^2 + (\pi N/f_o)^2} \right) \left\{ \frac{I_o[W_o\sqrt{\tau^2 - (N/2f_o)^2}]}{I_o[W_o\tau]} \right\}$$

where $B$ is the bandwidth, $K$ is the transition bandwidth falloff parameter, $I_o$ is a modified Bessel function of the first kind and zero order, $N$ is the number of gaps between interdigital fingers and $W_o$ is the ripple reduction parameter.

Calculation for the interdigital fingers having maximum overlap is effected by inserting the value $N = 0$ into the equation. Overlap of fingers on either side of the maximum overlap fingers ($N_{max}$ and $N_{min}$ fingers) are obtained by inserting negative and positive $N$ values to $N = 2(f_o\tau)$ into the equation.

It is a principal object of the invention to provide a new and improved surface acoustic wave filter.

It is another object of the invention to provide a new and improved method for constructing a surface acoustic wave filter.

It is another object of the invention to provide a new and improved surface acoustic wave filter having a flat frequency response in the passband and an exponentially decaying out of band response.

It is another object of the invention to provide surface acoustic wave filters and filter design technique that allow optimization of the trade off between achieving a low distortion time domain response while maintaining good frequency selectivity.

These, together with other objects, features and advantages of the invention, will become more readily apparent from the following detailed description when taken in conjunction with the illustrative embodiment in the accompanying drawings.

DESCRIPTION OF THE DRAWINGS

FIG. 7 is an experimental plot of insertion loss versus frequency for a surface acoustic wave flat/exponential filter of FIG. 1.

DETAILED DESCRIPTION OF THE PREFERRED EMBODIMENT

Figure 1:
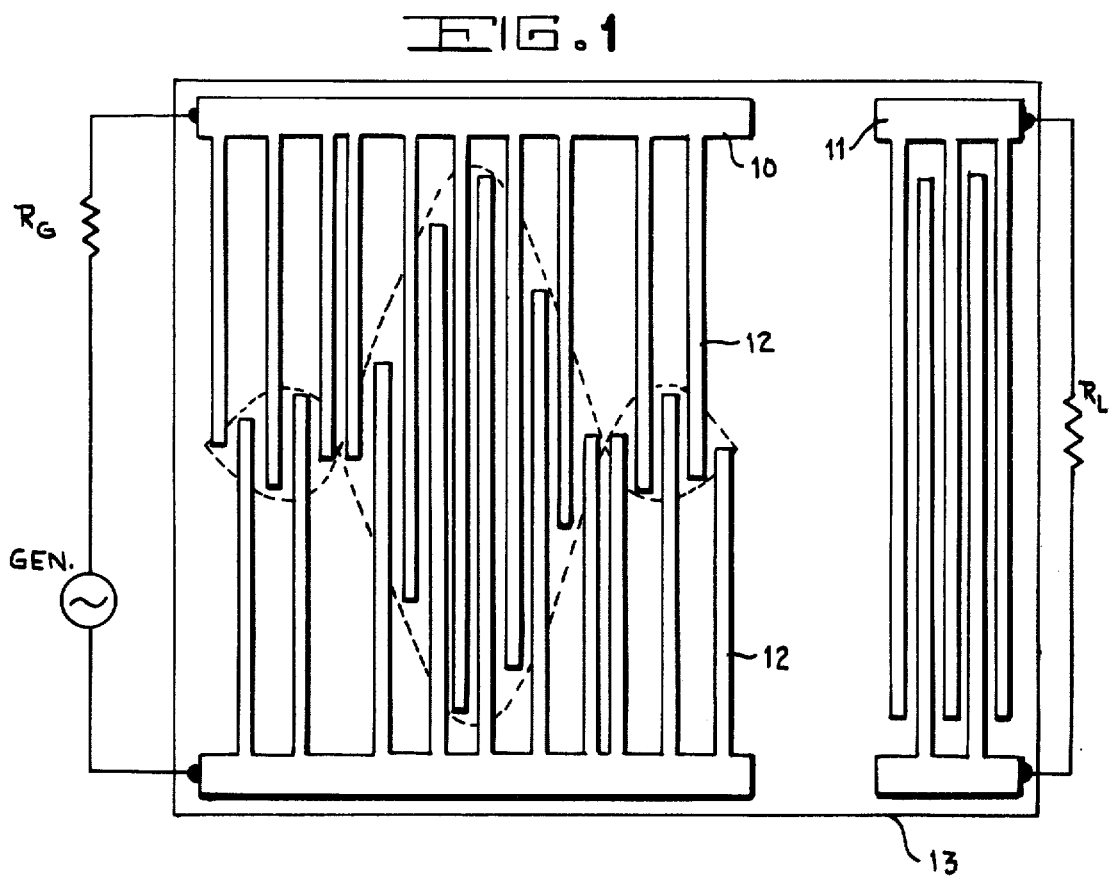
FIG. 1 is a schematic drawing of two interdigital transducers comprising a surface acoustic wave filter.
Figure 2:
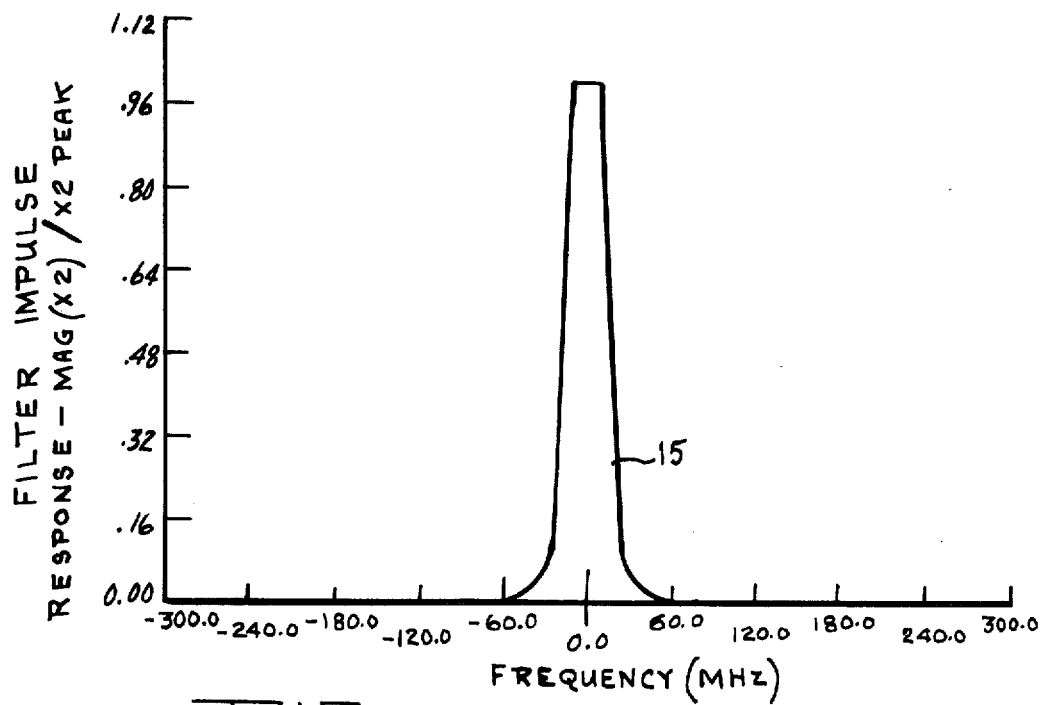
FIG. 2 is a linear scale magnitude response for a flat/exponential surface acoustic wave bandpass filter with 20 MHz bandwidth having its response normalized such that its maximum value is unity.

A simplified illustration of a surface acoustic wave (SAW) filter of the type comprehended by the invention is illustrated in FIG. 1. The transducers 10, 11 depicted in FIG. 1 include interdigital fingers 12 whose overlap is controlled in order to achieve a desired bandpass frequency characteristic. Applying an impulse excitation to an interdigital transducer yields an acoustic response which is the spatial replica of the transducer geometric pattern. In the frequency domain the resonant frequency, bandwidth and amplitude are dependent on the electrode spacing, transducer length, and electrode overlap (apodization). Furthermore, the electrode spacing determines the delay or phase response. These characteristics, as well as the fixed delay due to the physical separation beween the input and output transducers 10 and 11, respectively, are also dependent upon the piezoelectric material parameters of the substrate member 13 such as coupling coefficient, dielectric constant, and surface wave velocity. The overall SAW filter frequency response, as measured across the load $R_L$, is proportional to the product of the Fourier transformed input and output responses. For many applications where both time and frequency domain considerations are important, filters having highly selective frequency domain and low distortion time domain characteristics are desirable. It is this problem which is addressed by the present invention. The solution herein presented comprises a filter realizable with SAW techniques, having a flat passband, an exponentially decaying transition band, and a linear phase characteristic. The frequency response of such a filter is shown in FIG. 2 wherein response curve 15 represents a device consisting of 403 double electrode pairs.

A SAW filter, with $(N_{max} + N_{min} + 2)$ uniformly spaced electrodes, possesses a complex frequency response $X(f)$ which in the simplified ideal case and in the absence of second order effects is represented by the summation in Equation (1):

$$X(f) = \sum_{N=N_{min}}^{N_{max}} H_o[N] e^{-j\pi N(f-f_o)/f_o} \quad (1)$$

where the coefficients $H_o[N]$ specify the overlap of each electrode, $f_o$ denotes the filter center frequency, $N_{max}$ is the number of interdigital finger gaps to the side of the point of maximum overlap and $N_{min}$ is the number of interdigital finger gaps to the other side. In order to achieve a magnitude response with desired shape and bandwidth, values for parameters $H_o[N]$ $N_{max}$ and $N_{min}$ must be appropriately determined. This is accomplished in the following manner. Assume a bandpass filter having (baseband) frequency characteristics as follows:

$$H(f) = \begin{cases} \rho^{K[f+B/2]} & -\infty < f - B/2 \\ 1 & -B/2 \le f \le B/2 \\ \rho^{-K[f-B/2]} & B/2 < f < \infty \end{cases} \quad (2)$$

where $B$ is the desired bandwidth and $K$ the transition bandwidth falloff parameter.

The time response corresponding to Equation (2) is obtained by taking the Fourier Transform.

$$H_o(t) = \int_{-\infty}^{-B/2} \rho^{K[f+B/2]} e^{j2\pi ft} df + \int_{-B/2}^{B/2} e^{j2\pi ft} df + \int_{B/2}^{\infty} \rho^{-K[f-B/2]} e^{j2\pi ft} df \quad (3)$$

or $$H_o(t) = \frac{\rho^{-j\pi tB}}{K + j2\pi t} + B \frac{e^{j\pi tB} - e^{-j\pi tB}}{2j\pi tB} + \frac{e^{j\pi tB}}{K - j2\pi t} \quad (4)$$

Using simple identities and grouping terms yields:

$$H_o(t) = B \frac{\sin\pi tB}{\pi tB} + \frac{2K \cos\pi tB}{K^2+(2\pi t)^2} - \frac{4\pi t \sin\pi tB}{K^2+(2\pi t)^2} \quad (5)$$

In order to obtain the $H_o[N]$ coefficients discussed above it is necessary to recognize that the interdigital transducer samples the time function at multiples of one-half the acoustic wavelength. Thus the sampling period is:

$$T_s = \frac{\Lambda}{2v_s} = \frac{1}{2f_o} \quad (6)$$

where $\Lambda$ is the acoustic wavelength and $v_s$ the surface wave velocity. Thus the finger overlap values $H_o[N]$ result from evaluating Equation (5) at $t=N/2f_o$. Using Equation (5) directly would require an infinitely long impulse response (or transducer) and thus truncation must be adopted. By using particular weighting functions, for example here the Kaiser window has been adopted, the Gibbs ripple phenomena can be minimized. The final expression for $H_o[N]$ can then be written as:

$$H_o[N] = \left( \frac{\sin\pi BN/2f_o}{\pi N/2f_o} + \frac{2K\cos\pi BN/2f_o}{K^2+(\pi N/f_o)^2} - \frac{(2\pi N/f_o)\sin\pi BN(2f_o)}{K^2+(\pi N/f_o)^2} \right) \frac{I_o[W_n\sqrt{\tau^2-(N/2f_o)^2}]}{I_o[W_n\tau]}$$

where $\tau$ is the filter times length parameter; the weighting function within the second set of brackets is zero for $|N/2f_o| > \tau$; $I_o$ is the modified Bessel function of the first kind and zero order; and $W_n$ is a parameter used to reduce ripple at the expense of increasing the main beam width.

By way of example, computer generated pulse responses are provided for a flat/exponential filter of the type comprehended by the invention.

Filters of 10 and 20 MHz bandwidths were excited with both narrow (0.1 microsecond) and wide (1.0 microsecond) video pulses.

Figure 3:
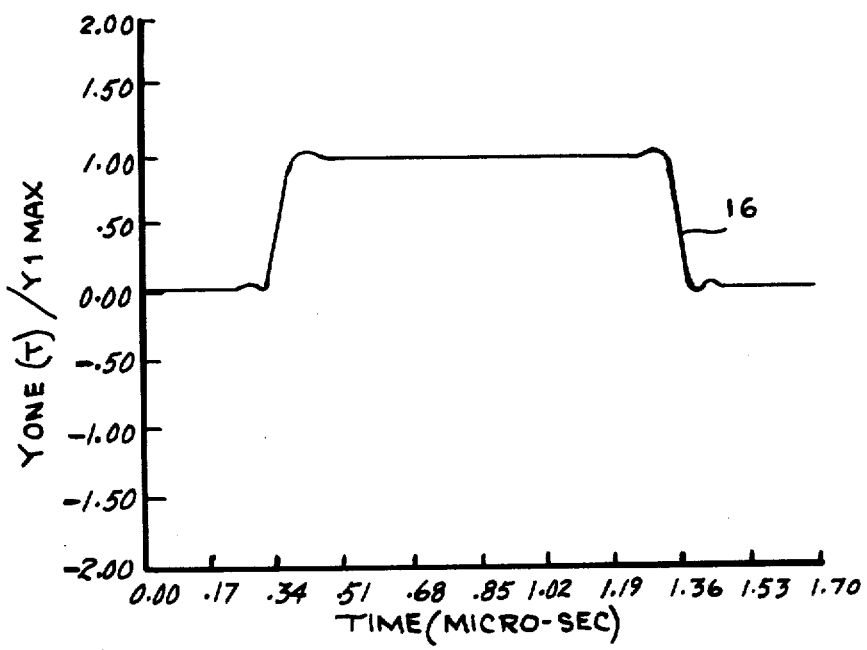
FIGS. 3 and 4 are responses of surface acoustic wave flat/exponential bandpass filters with 10 MHz (FIG. 3) and 20 MHz (FIG. 4) bandwidth to a 1.0 micro second video pulse.

Curve 16 of FIG. 3 illustrates the response of a surface acoustic wave flat/exponential bandpass filter with 10 MHz bandwidth to a 1.0 microsecond video pulse. Filter parameters were $f_o = 335$ MHz, $B = 1.0$ MHz, $K = 0.20000 \times 10^{-6}$, and $W_n\tau = 4.0$.

Figure 4:
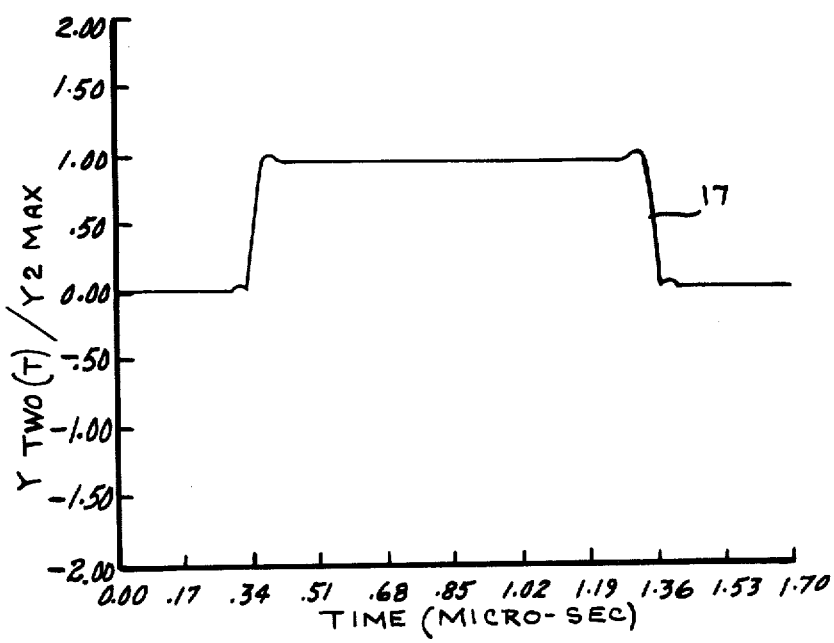

Curve 17 of FIG. 4 illustrates the response of a surface acoustic wave flat/exponential bandpass filter with 20 MHz bandwidth to a 1.0 microsecond video pulse. Filter parameters were $f_o = 335$ MHz, $B = 120$ MHz, $K = 0.15029 \times 10^{-6}$ and $W_n\tau = 4.0$.

Figure 5:
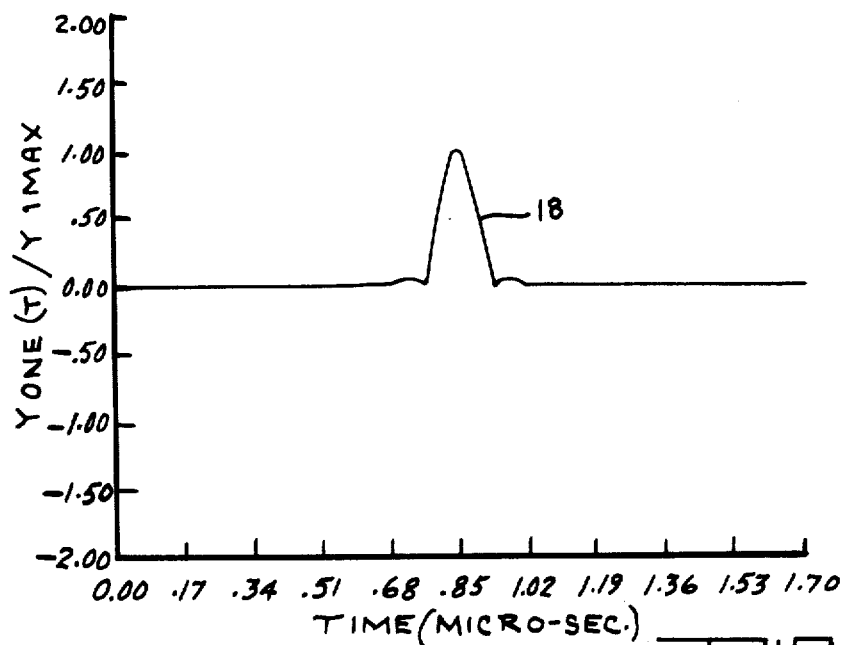
FIGS. 5 and 6 are responses of surface acoustic wave flat/exponential bandpass filters with 10 MHz (FIG. 5) and 20 MHz (FIG. 6) bandwidths to a 0.1 micro second video pulse.

Curve 18 of FIG. 5 illustrates the response of a surface acoustic wave flat/exponential bandpass filter with a 10 MHz bandwidth to a 0.1 microsecond video pulse. Filter parameters were $f_o = 335$ MHz, $B = 10$ MHz, $K = 0.20000 \times 10^{-6}$, and $W_n = 4.0$.

Figure 6:
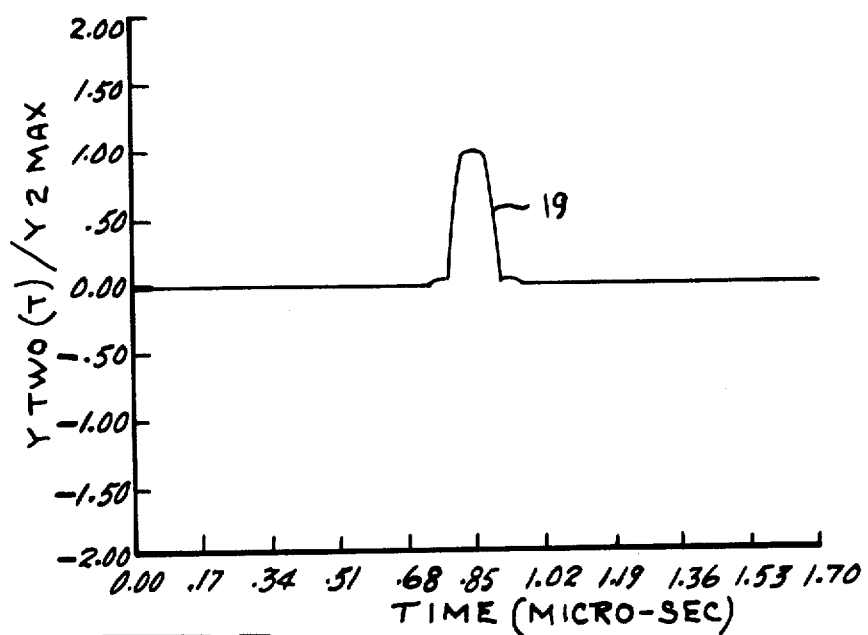

Curve 19 of FIG. 6 illustrates the response of a surface acoustic wave flat/exponential bandpass filter with a 20 MHz bandwidth to a 0.1 microsecond video pulse. Filter parameters were $f_o = 335$ MHz, $B = 20$ MHz, $K = 0.15029 \times 10^{-6}$, and $W_n\tau = 4.0$.

In order to compute the video time responses shown in FIGS. 3–6, the SAW bandpass frequency functions $X(f)$ were translated to baseband without loss of generality under the usual assumptions. $X(f)$ was then multiplied by the Fourier spectrum of a band limited (limited to 600 MHz) rectangular pulse of appropriate width. The resulting frequency response was transformed digitally using well-known techniques.

As can be seen from the time responses depicted in FIGS. 3–6 pulse distortion is minimal. In fact, the overshot for the FEF response to the wide 1.0 μsec pulse is only about 3.7 percent. (A lumped element Butterworth, for example, would have 4.4 percent overshoot. Thus the flat/exponential filter of the invention is shown to be particuallrly suited to the transmission of narrow pulses; pulses with frequency spectra of the same order as the filter bandwidth.

Finally, an experimental spectrum analyzer plot of insertion loss versus frequency is illustrated by curve 20 of FIG. 5. Center frequency is 330.1 MHz and the SAW substrate is lithium tantalate. Design parameters used were $K = 2.6105 \times 10^{-7}$, $B = 17.667$ MHz, $\tau = 1.7267 \times 10^{-7}$ and $W_n = 3.475 \times 10^7$.

While the invention has been described in terms of one presently preferred embodiment, it is understood that the words which have been used are words of description rather than words of limitation and that changes within the purview of the appended claims may be made without departing from the scope and spirit of the invention in its broader aspects.

What is claimed is:

1. A surface acoustic wave filter transducer having $4(f_o\tau)+2$ interdigital fingers and finger overlap coefficients $H_o[N]$ determined by the equation $$H_o[N] = \left\{ \frac{\sin\pi BN/2f_o}{\pi N/2f_o} + \frac{2K\cos\pi BN/2f_o}{K^2+(\pi N/f_o)^2} - \frac{(2\pi N/f_o)\sin\pi BN/2f_o}{K^2+(\pi N/f_o)^2} \right\} \left\{ \frac{I_o[W_n]\sqrt{\tau^2-(N/2f_o)^2}}{I_o[W_n\tau]} \right\}$$

wherein $N$ is the number of gaps between interdigital fingers $\tau$ is the filter time length parameter, $f_o$ is the filter center frequency, $B$ is the filter bandwidth, $K$ is the transistor bandwidth fall off parameter, $I_o$ is a modified Bessel function of the first kind and zero order and $W_n$ is the ripple reduction parameter.

2. The method of constructing a surface acoustic wave filter comprising the steps of selecting filter parameters for a filter time length parameter $\tau$, a filter center frequency $f_o$, a filter bandwidth $B$, a transition bandwidth fall off parameter $k$ and a ripple reduction parameter $W_n$, the values of $\tau$ and $f_o$ being such that the expression $2(f_o\tau)$ is an integer, providing a surface acoustic wave substrate member having properties consistent with said selected filter parameters, and affixing to the acoustic wave propagating surface of said substrate member an interdigital transducer having $4(f_o\tau)+2$ interdigital fingers with $N$ gap therebetween, the overlap coefficient $H_o(N)$ of adjacent fingers being defined by the expression $$H_o[N] = \left\{ \frac{\sin\pi BN/2f_o}{\pi N/2f_o} + \frac{2K\cos\pi BN/2f_o}{K^2+(\pi N/f)^2} - \frac{(2\pi N/f_o)\sin\pi BN/2f_o}{K^2+(\pi N/f_o)^2} \right\} \left( \frac{I_o[W_n]\sqrt{\gamma^2-(N/2f_o)^2}}{I_o[W_n\gamma]} \right)$$

* * * * *